United States Patent [19]

Adams

[11] 4,173,736
[45] Nov. 6, 1979

[54] CAPACITANCE DETECTING SYSTEM AND METHOD FOR TESTING WIRE CONNECTIONS

[75] Inventor: Charles K. Adams, St. Louis, Mo.

[73] Assignee: Western Electric Company, Incorporated, New York, N.Y.

[21] Appl. No.: 883,963

[22] Filed: Mar. 6, 1978

[51] Int. Cl.² .................... G01R 31/04; G01R 27/26; H03K 3/284
[52] U.S. Cl. .................... 324/51; 324/60 C; 331/65; 331/113 R; 331/144
[58] Field of Search ............ 324/51, 52, 60 R, 61 R, 324/60 C; 331/65, 113 R, 144

[56] References Cited
U.S. PATENT DOCUMENTS

| | | | |
|---|---|---|---|
| 2,476,317 | 7/1949 | Nelson et al. | 324/52 |
| 2,490,377 | 12/1949 | MacLean | 324/52 X |
| 3,253,153 | 5/1966 | Stoddard | 331/113 R |
| 3,375,716 | 4/1968 | Hersch | 331/144 X |
| 3,389,789 | 6/1968 | Watson et al. | 324/54 UX |
| 3,613,025 | 10/1971 | Joosten | 331/113 R X |
| 3,689,830 | 9/1972 | Caldwell et al. | 324/51 |
| 3,747,407 | 7/1973 | Wallman | 331/113 R X |
| 3,986,106 | 10/1976 | Shuck | 324/51 |
| 3,999,148 | 12/1976 | Miesterfeld | 331/113 R X |
| 4,091,671 | 5/1978 | McLees | 331/65 |

OTHER PUBLICATIONS

DC and Low-Frequency Line Testing, Electrical Engineer's Handbook, 4th Edition, Pender-McIllwain, Copyright 1950, pp. 11-41, 42.

*Primary Examiner*—Gerard R. Strecker
*Attorney, Agent, or Firm*—R. P. Miller

[57] ABSTRACT

A computer controlled facility is provided to detect capacitance, and hence defective connections, between a group of wires in a telephone handset cord and terminal blades of plugs connected at both ends of the cord. The test depends upon ascertaining the capacitance between a properly connected terminal blade and wire and the other terminal blade and wire connections to provide exact indications of the terminal blades and wires which are not properly connected. Capacitance is detected by connecting a good wire and blade connection along with another wire and blade in a capacitance network associated with one stage of a free running multivibrator which produces an output wave in accordance with the capacitance between the connected pairs of wires and blades. A delayed pulse is cyclically generated to act in conjunction with the output wave to control a bank of indicator lights to provide an indication of any defective wire to blade connections.

7 Claims, 5 Drawing Figures

U.S. Patent  Nov. 6, 1979  Sheet 1 of 2  4,173,736
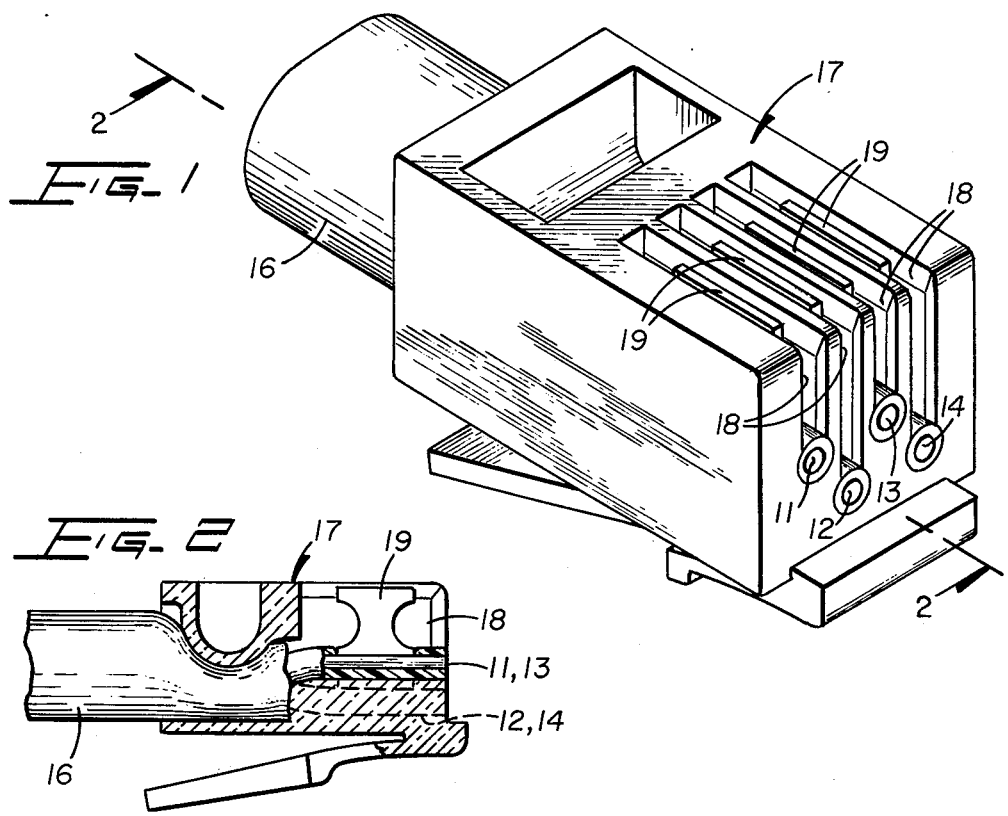
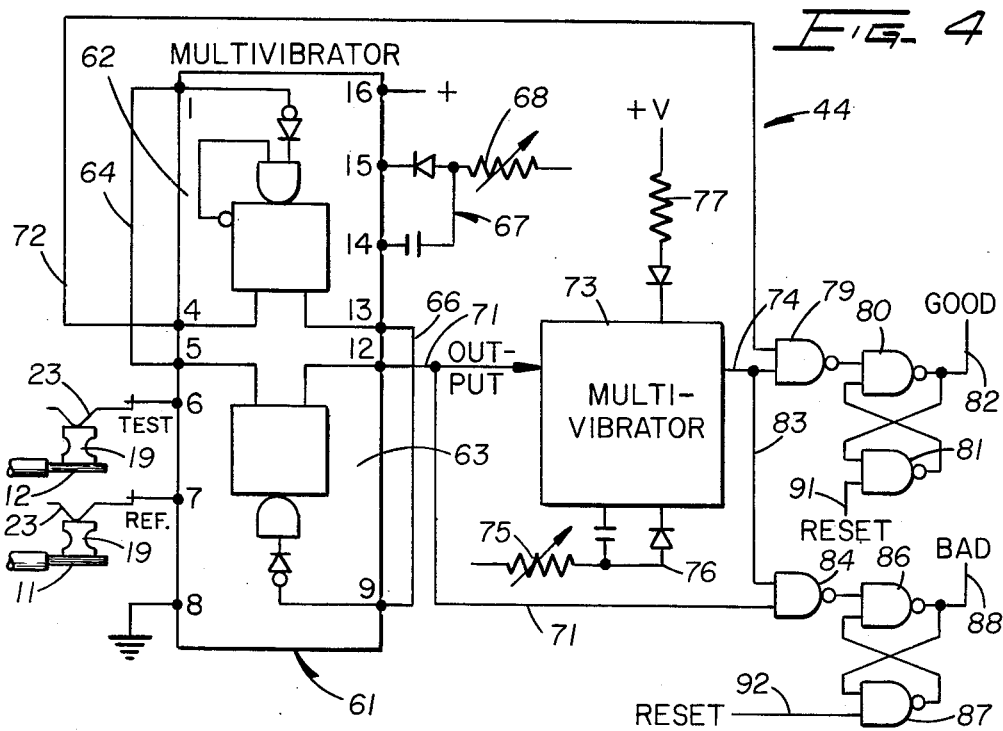

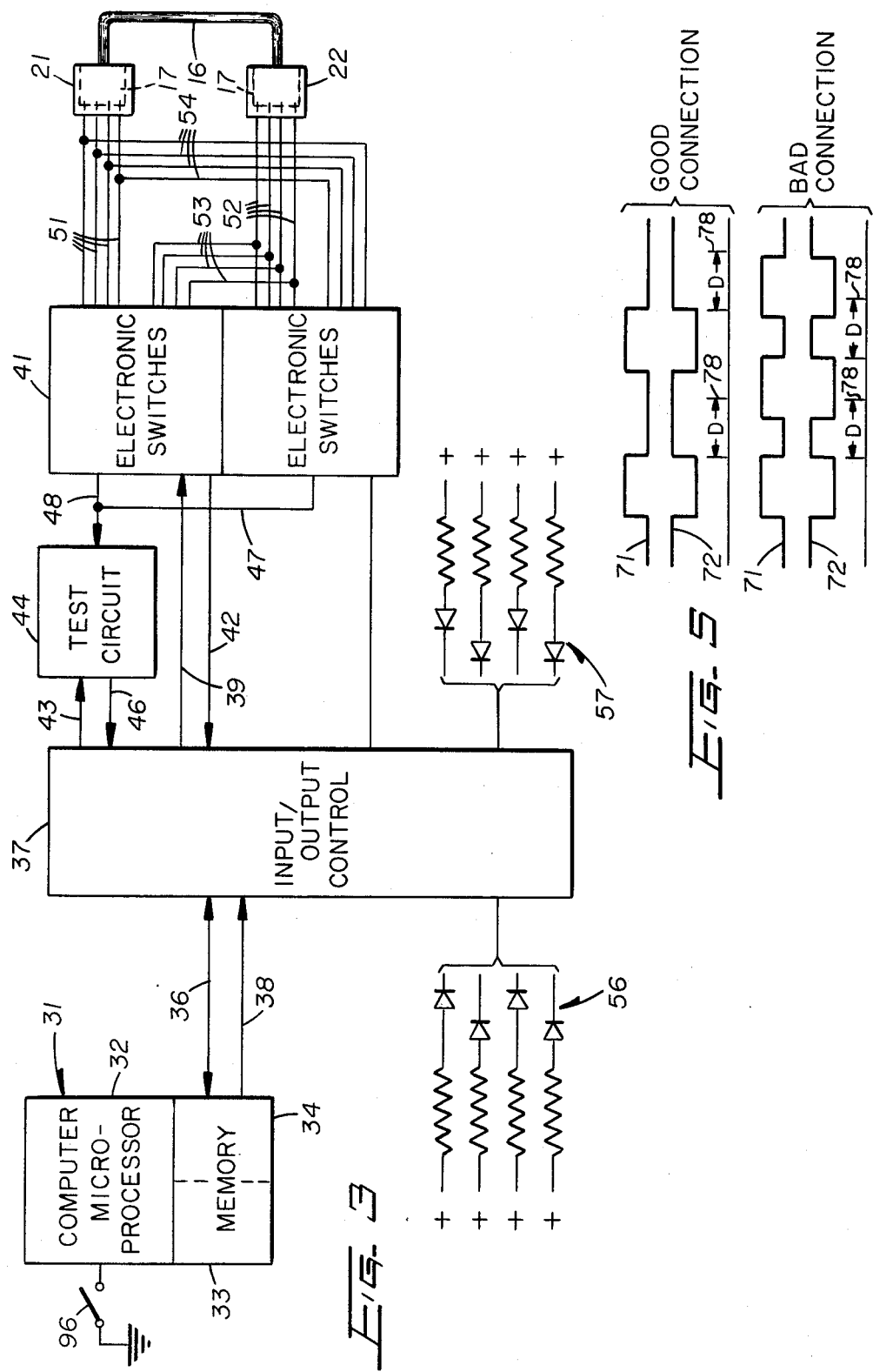

CAPACITANCE DETECTING SYSTEM AND METHOD FOR TESTING WIRE CONNECTIONS

FIELD OF INVENTION

This invention relates to a capacitance detecting system and method for testing wire connections, and more particularly to a system and method for connecting a reference good wire connection and an unknown wire connection as capacitor elements in a control network of a free running multivibrator to modulate the output signal in accordance with the capacitance between the wire connections.

BACKGROUND ART

Electrical connectors, such as plugs and jacks, are often connected at opposite ends of multi-wire cables or cords. Subsequent to the connection of the connectors, it is necessary that tests be conducted to determine the integrity of the connections between the individual wires and terminal elements forming parts of the connectors. Recently in the telephone industry, the telephone set has been modulized to permit the rapid installation or removal of cords that run from the telephone handset to the telephone base and cords which run from the telephone set to wall jacks. The cords usually comprise four insulated wires jacketed in a plastic sheath and have plugs with terminal blades or plates electrically contacting the individual wires.

The present invention is concerned in one specific application to a test system for detecting faulty connections between these terminal blades and the individual wires. The test system includes facilities for precisely indicating which terminal blade is not properly in contact with an associated wire.

Through the years numerous test facilities have been developed to test the integrity of connections between contact elements of connectors and individual wires. In addition, these facilities have incorporated means to detect shorts and breaks between wires making up the cable or electrical cord. Invariably, these test facilities included circuits for conducting continuity tests, that is whether a wire will pass or not pass test current. In other instances, the test facilities have included a bridge circuit of one sort or another.

An example of a multiple wire test set is shown in U.S. Pat. No. 3,986,106 issued to E. E. Shuck et al. on Oct. 12, 1976, wherein there is disclosed a test set having facilities for sequentially checking wires having plugs attached to opposite ends. The patent discloses a system which connects distinctive resistors to each wire pair and then executes a comparison test against like resistors mounted in the test set so as to provide an indication of any of a number of faults in the wire pairs, such as lack of continuity, crosses, shorts and reverses between wire pairs. In essence, the test system depends upon the utilization of continuity and resistance comparison tests.

As previously mentioned the prior art is replete with various configurations of bridge circuits for checking wire continuity and determining location of faults in wires making up a cable. Among the more well-known bridge test circuits are the Varley and Murray loops. The Varley loop connects wire pairs as resistance elements in one arm of a Wheatstone bridge to detect the location of a fault such as a ground. The Murray loop test system uses an A.C. bridge having a wire to be tested connected as a distributed capacitance to one arm of the bridge. The test arm of the bridge is matched with an adjustable capacitance arm. By adjusting the capacitance, a match can be made with the distributed capacitance of a wire under test so that an indication may be provided to inform a test operator as to the location of any fault in the wire under test. In general, it should be also noted that the prior art test systems usually require the utilization of significant amounts of current and power.

In testing telephone set cords, it is necessary that the tests be conducted with minute currents, e.g., 10–100 microamps, to insure that the plug contact elements are in good electrical contact with the wires in the cord. Further, there is a need to provide a programmable system for rapidly checking the integrity of wire connections to terminals while at the same time providing an instantaneous indication as to which connections are defective. There are numerous other occasions where there is a need to provide a test system to rapidly indicate the capacitance between a pair of spaced electrically conducting members which may be wire connections, capacitor plates or other spaced electrically conductive members.

SUMMARY OF THE INVENTION

The present invention contemplates, among other things, a system and method for indicating capacitance between a pair of metallic members wherein the members are selectively connected into a capacitance network which controls the operation of a free running multivibrator to produce a voltage wave output which can be electrically strobed to provide an indication of the capacitance between the members.

In a specific application of the invention, a system is disclosed for detecting the magnitude of capacitance between a reference wire connection to a terminal of a connector and an unknown wire connection to another terminal of the same connector and, thus, provide information that can be utilized to determine the integrity of the unknown wire connection.

More particularly, a telephone handset cord having plugs at both ends of the cord are connected into the test facility and an initial D.C. continuity test is conducted to determine which wires are properly connected to both plugs and which wires have one or more defective connections. Subsequent thereto, a properly connected wire and a defectively connected wire are connected as capacitance elements in one stage of a free running multivibrator to modulate the output of the multivibrator in accordance with the integrity of the wire connection. If the connection between the plug terminal and its associated wire is satisfactory, a first voltage wave is produced which differs from the voltage wave which is produced when that particular plug terminal and wire connection is defective. The output from the multivibrator is electrically strobed with a delayed timing pulse to control a pair of gating circuits to produce output signals indicative of good or bad connections. The entire test facility is designed to be under the control of a programmed computer.

BRIEF DESCRIPTION OF THE DRAWINGS

A more complete understanding of the invention may be had by referring to the following detailed description when considered in conjunction with the accompanying drawings, wherein FIG. 1 is a perspective view of a plug attached to a telephone handset cord which may be tested in accordance with the principles of the present invention;

FIG. 2 is a sectional view taken along line 2—2 of FIG. 1 showing a terminal blade contacting a wire to establish an electrical connection with the wire;

FIG. 3 is a schematic diagram of a programmed computer control system for testing the integrity of the electrical connections between the terminal blades and wires in the plug shown in FIGS. 1 and 2;

FIG. 4 is a schematic diagram of a multivibrator control capacitance test facility that is used to detect the capacitance between a pair of conductive members, such as a pair of blade-wire connections made within the plug shown in FIGS. 1 and 2 and to further provide an indication of the integrity of the blade-wire connections; and FIG. 5 is a wave form diagram showing voltage outputs from the multivibrator circuit of FIG. 4 that are indicative of good and defective connections between the wires and the terminal blades.

DETAILED DESCRIPTION

In order to illustrate the principles of the invention a detailed description of the invention will be made as applied to testing the integrity of electrical connections between terminal elements of a plug and wire emanating from the plug.

In FIGS. 1 and 2, there is disclosed a modular telephone handset cord of the type shown in U.S. Pat. No. 3,369,214 issued to C. L. Krumreich et al. on Feb. 13, 1968. More specifically, the usual telephone cord contains four wires 11, 12, 13 and 14 individually jacketed in a plastic insulation and encased in an outer plastic jacket 16. Each end of the cord is terminated with a plastic plug 17 having slots 18 to accommodate terminal blades 19 which are pressed into the slots to pierce the insulated wires and establish electrical connections between the terminal blades and the contacted wires. Prior to shipment of the cords or assembly of the telephone cords with telephone sets, it is necessary to detect any faulty connection between a blade 19 and its associated wire. If a faulty connection is determined, a conductive fluid, such as silver-filled acrylic, can be injected into the slot areas around wires 11, 12, 13 and 14 to further establish an electrical connection between the blade and its associated wire.

It is important to test the electrical connection between blade 19 and its associated wire with small currents because communication wires, such as telephone handset cord wires, will only conduct small currents during normal use. A test system and method are illustrated in FIGS. 3, 4 and 5 wherein defective blade-wire connections are checked with small currents, e.g., 100-100 microamps, and faulty connections are indicated in such a fashion as to apprise the attending operator as to the exact location of the defective terminal blade-wire connection.

The plugs 17 secured to the opposite ends of the cord 16 are inserted in jacks 21 and 22 to connect the terminal blades 19 in both plugs to the test facility and the control system. The jack may be a replica of the modular jacks used on a standard telephone set and which are further disclosed in the afore-identified Krumreich patent. In general, the disclosed system will initially conduct continuity tests to identify those wires having one or both ends of the wire improperly contacting the associated terminal blades 19. The electrical connection to the system is more explicitly illustrated in FIG. 4 where wires 11 and 12 contact associated blades 19 which, in turn, are engaged by spring terminal wires 23 mounted in the jacks 21 and 22.

In operation of the system and in carrying out the method, a computer system is illustrated, but it is to be understood that other sequencing systems could be used or the principles of the invention could be utilized in a semi-manual system wherein each terminal blade to wire connection is tested.

FIG. 3 shows the system under the control of a microcomputer, such as a standard 80/10 single board computer 31 which includes a 8080 microprocessor 32, a 1702 EPROM (Eraseable Programmable Read Only Memory) memory 33 and a 8111 RAM (Random Access Memory) memory 34, all of which are commercially available from the Intel Corporation of Santa Barbara, Calif. The computer 31 is connected by a data buss 36 to an input-output I/O control unit 37, such as a 8255 IC which is also commercially available from Intel.

The computer 31 is also connected through a control buss 38 to the I/O control unit. Signals impressed over the control buss instruct the control unit as to the manner and paths that information or data signals are to be routed to other elements of the system. A control path 39 runs from the control unit 37 to banks of FET switches 41 which are selectively operated to sequentially connect each terminal blade-wire connection to the system for test. The results of the test are applied back through the response control path 42 to the I/O control unit 37 which routes the response signals back to the computer. The control unit 37 is also connected to route reset and start signals onto a path 43 to a unique capacitance test circuit 44 which is further illustrated in detail in FIG. 4.

The results ascertained by the test circuit 44 are routed back over a path 46 and through the I/O control unit to the computer 31. The test set 44 is connected through the electronic switches 41 to the individual blade-wire connections in the plugs connected to the cord 16. During the test a reference blade and wire connection are selected and then matched with the other blade-wire connections to form, in effect, the plates of a capacitor which are selectively connected over paths 47 and 48 to the test set 44.

During an initial continuity test, the wires of the cord and the blades associated with each end are sequentially connected into the test circuit by applying first test signals over four leads 51, through cord 16 and through test wires 52. During the individual capacitance testing between a reference wire and a defective wire, connections are established between each reference wire and a defective wire by sequence connections through the switches 41 to banks of wires 53 and 54.

The analyses of the test are applied over path 46 to control the I/O control unit 37 back to the computer over path 36. The computer actuates over paths 36 and 38 the I/O control unit to selectively operate banks of indicator lights 56 and 57. Lights 56 which may be light emitting diodes are selectively illuminated to indicate individual defective blade-wire connections in a first plug 17 connected to a first end of the cord 16, while light emitting diodes 57 are selectively illuminated to indicate individual faulty blade-wire connections in the plug connected to the other end of the cord 16.

Referring now to FIG. 4 for a consideration of the details of the test circuit 44, there is shown a free running multivibrator 61 having stages 62 and 63 cross-coupled with each other through leads 64 and 66. The multivibrator has ports numbered 1-16 and may be a dual monostable multivibrator of the type designated 74123 and sold by the Signetics Company and Texas Instruments Co. Connected to stage 62 is a capacitance network 67 having an adjustable or fixed resistor 68 for controlling the period of operation of this stage. The period of operation of stage 63 is controlled by connecting a terminal blade 19 and an associated wire to one capacitance input of the stage 63, abd connecting another terminal blade 19 and an associated wire as the second capacitance input to control the period of operation of the stage 63.

In effect, stage 63 is controlled to produce an output in accordance with the capacitance between the wires 11 and 12. If wires 11 and 12 properly contact their associated blades 19 then a significant capacitance will be impressed to control the period of operation of the stage 63. However, if the test connection proves that blade 19 is not properly contacting wire 12 there will be a significant drop in the capacitance for controlling the period of operation of the stage 62. If both blades 19 contact wires then the output of the multivibrator impressed on leads 71 and 72 will assume the complementary square-wave shapes designated in wave forms associated with FIG. 5.

The wave impressed on lead 71 is applied to initiate upon each positive to negative transition a cycle of operation of a one-shot multivibrator 73. This multivibrator may be of the same type used as multivibrator 61 but connected to operate as a delayed one-shot multivibrator to produce a train of delayed pulses on an output lead 74. The pulses on lead 74 are delayed in accordance with a setting of a resistance 75 connected to a capacitance network 76 controlling the cycle of operation of the one-shot multivibrator 73. The width of pulse output impressed on lead 74 is set by a resistor 77, and is, in effect, no more than a pip 78 which may be termed a "strobe pulse."

In situations where there exists good connections between the terminal blades 19 and their associated wire, the delay strobe pulse 78 will occur during a positive portion of the complementary voltage wave impressed on lead 72. As a result, two positive inputs will be simultaneously impressed on a NAND gate 79 operating this gate to impress a decreased potential to an input of one of a pair of latching NAND gates 80 and 81. Inasmuch as the other input to NAND gate 80 is controlled by a low output from NAND gate 81, the gate 80 applies a positive going condition on lead 82 which condition is held latched until a reset pulse is applied to NAND gate 81. The positive going signal impressed on lead 82 is representative of a good electrical connection between the test terminal blade 19 and its associated wire 12.

If there is a bad connection so that terminal blade 19 does not properly contact associated wire 12, then there is a significant drop in the capacitance associated with the multivibrator stage 63 and, as a consequence, its period of operation will be curtailed. The output from the multivibrator 61 will now be in accordance with the wave forms associated with the bracketed term "bad connection." It will be noted that the positive going pulses applied on lead 71 are much closer together so that the strobe pulse 78 now coincides with the successive positive going pulse impressed on lead 71. In this instance, the appearance of the positive going strobe pulse 78 on lead 74 results in a like increase being impressed over lead 83 to a first input of a NAND gate 84. The pulse impressed over lead 83 occurs during the positive portion of the pulse on the lead 71 to the second input for the NAND gate 84.

Concurrent applications of positive going signals to the input of gate 84 results in a drop in potential being impressed on a first input to an NAND gate 86. The other input to this gate is controlled by a NAND gate 87 of a second latching gate circuit which is set to impress a low potential to the second input to gate 86 whereupon the appearance of the reduced potential to the first input causes gate 86 to react and impress an increased potential over an output lead 88.

This output from the test circuit 44 is applied back through path 46 (see FIG. 3) through the I/O control unit to the computer which, in turn, will control the I/O control unit to operate the appropriate one of the light emitting diodes in banks 56 and 57 to indicate exactly which blade to wire connection is defective.

Following each test of a faulty or a suspected faulty blade 19 to wire connection, signals are sent to the computer which, in turn, issues control signals to commence the testing of the next suspected defective blade to wire connection. Following each test, the NAND gates associated with the test set are reset by appropriate signals being impressed on leads 91 and 92. It should be noted that the relative position of the strobe pulse 78 with respect to the negative-positive transition impressed on lead 71 is proportional to the magnitude of the capacitance connected between the spring contacts 23. Though the system is described with respect to testing the integrity of connections between terminal blades and wires, it may be also used in many other applications where there is a need to readily determine the existence or the magnitude of a capacitance between two conductive members. Signals may be readily developed representative of the time increment between pip 78 and the next negative to positive transition impressed on lead 71 to provide a direct indication of the magnitude of an unknown capacitor connected to the multivibrator 61.

In summary of the practice of the method and the operation of the system, an operator places plugs 17 on the ends of a cord 16 in jacks 21 and 22. The test is under the control of the computer 31 which has the test program stored in the program read only memory 33.

The test is actually started by the operator closing a reset switch 96 whereupon the microprocessor 32 commences to impress data signals over the buss 36 in accordance with the stored program. Control signals are impressed over buss 38 to operate the input-output control unit 37 so as to apply a series of signals through the control path 39 to sequentially operate the electronic switches 41, whereupon continuity or constant current signals are impressed over leads 51, through the terminal blades 19 of the plug 17 within jack 21, the wires of the cord 16, the terminal blades connected in the plug 17 within the jack 22, and from there to the wires 52 running back to the electronic switch banks 41.

Continuity indications are impressed back over control path 42 to the control unit 37 which is effective to impress these signals over the data buss 36 where the signals are routed and stored in the RAM memory 34. If the continuity test indicates proper terminal blade to wire connections with all wires, none of the lights 56 or 57 are illuminated and, thus, the operator is apprised of a satisfactory cord. If the continuity test indicates that there is at least one defective blade to wire connection then capacitance tests are sequentially conducted using one known good wire with good blade connections at both ends as a reference. The test contemplates connecting one suspected faulty wire to blade connection in capacitive relationship with the known good wire to blade connection at that same end of the wire. If the capacitance test indicates a good wire to blade connection, then the blade to wire connection at the other end of this wire is tested. If the capacitance test indicated a bad connection, then one of the LED devices 56 or 57 will be illuminated to give a precise indication of the faulty blade to wire connection so that the operator can inject the conductive silver-filled acrylic compound into the appropriate slot area about the leads 11, 12, 13 or 14 associated with the defective connection.

Recapitulating briefly on the operation of the test facility and referring to FIGS. 4 and 5, the presence of good blade 19 to wire 12 connection will control the multivibrator 61 to impress a square-wave output on the lead 71. It should be understood that in the drawing in FIG. 4, the electronic switches 41 are eliminated for purposes of clarity, but it is to be understood that all eight blade to wire connections of a four-wire cord are selectively connected into the control stage 63 of the multivibrator 61. The positive to negative transition of the output wave 71 initiates operation of the one-shot multivibrator 73 to produce the narrow strobe pulse 78. If this strobe pulse occurs during the down portion of the wave impressed on lead 71 none of the LED devices 56 or 57 are operated.

If, however, a faulty blade to wire connection is connected to the test port 6 of the multivibrator, the capacitance between the terminal blades and the associated wires is extremely small and, as a result, the period of operation of stage 63 of the multivibrator is reduced. This condition is illustrated in FIG. 5 by the bracketed wave form labeled "bad connection", and in this instance it will be noted that the down time of the voltage wave impressed on 71 is much shorter than the down time of the same wave shown and labeled "good connection." In this instance, the pulse 78 is generated at the same time that the next subsequent positive portion of the wave is impressed on the lead 71. At this time, strobe pulse 78 and the positive pulse on 71 are simultaneously applied to the NAND gate 84 to control the impression of a bad blade to wire connection signal on the output lead 88. The operation of the NAND gate operates the latching NAND gates 86 and 87 to maintain the bad blade to wire connection signal on the lead 88 until a reset pulse is impressed on the lead 92.

Those blade to wire connections which are good result in operation of the NAND gate 79 to set the NAND gate latches 80,81 to impress a signal on line 82 which is indicative of a good connection.

At the completion of the test, the bad blade to wire connections will be indicated by the appropriate illumination of the LED's in banks 56 and 57. The operator may withdraw the plugs 17 from the jacks and inject the silver-filled acrylic into the appropriate slots 19, and then retest the cord. It is to be understood, however, that the jacks 21 and 22 could be slotted in alignment with the slots 18 so that the injection of the conductive silver-filled acrylic can occur prior to removal of the plug 17.

Further, it is to be understood that the test facilities shown in FIG. 4 can be used to indicate whether or not an unknown capacitance connected to ports 6 and 7 of the multivibrator 61 is above or below a predetermined value. In this instance a connected capacitance above the predetermined value will cause the strobe pulses to occur during each succeeding down time of the pulse wave impressed on lead 71. The concurrent occurrence of a positive going pulse on lead 72 and the strobe pulse on lead 71 results in the operation of the good NAND gate 79 and the associated latching NAND gates 80,81 to impress a signal condition on lead 82 indicative of a capacitance at or above the predetermined value.

If the connected unknown capacitance is below the predetermined value, then the strobe pulse occurs during the next succeeding positive going pulse impressed on the lead 71. As a result, the bad NAND gate 84 and its associated latching gates 86,87 are operated so that a signal is impressed on lead 88 indicative of a connected capacitance which is below the predetermined value. The setting of the predetermined value may be changed by adjusting the resistor 75 to vary the time of delay of the strobe pulse and, hence, its relative position with respect to the positive going pulses impressed on leads 71 and 72 to accordingly increase or decrease the predetermined value of capacitance for which the unknown capacitor is being tested.

What is claimed is:

1. A system for detecting whether or not an unknown capacitor is above or below a predetermined capacitance level, which comprises:

a free running multivibrator having a pair of cross-coupled networks and a pair of capacitance networks for setting the duration of pulses of trains of output pulses;

means for connecting the unknown capacitance in one of said capacitance networks to produce a first pulse train having pulse durations determined by the value of the unknown capacitance, and a second pulse train having pulses of constant duration which are spaced in accordance with the value of the unknown capacitance;

means responsive to each transition in a first direction in the second pulse train for generating delayed strobing pulses; and a pair of gating means selectively operated upon occurrences of coincidence of said strobing pulses with either said first or second pulse train for producing output signals indicative of whether or not said unknown capacitance is above or below the predetermined capacitance level.

2. A system for indicating the capacitance between a pair of conductive members, which comprises:

a free running multivibrator having cross-coupled pulse generating stages, each of which has a capacitance controlled timing network to determine the duration of each pulse;

means connecting the capacitance between the conductive members into a first timing network for generating a first series of constant duration positive output pulses, the time spacing of which is determined by the capacitance between said members, and a complementary second series of positive output pulses, the duration of which is determined by the capacitance between said members;

means responsive to positive to negative transitions of said first series of pulses for generating a series of timing pulses which are delayed a predetermined increment of time;

first gating means rendered effective by the generation of each timing pulse within the time durations of the positive portions of the complementary pulses for generating an output signal indicative of at least a predetermined capacitance between said members; and second gating means rendered effective by the generation of each timing pulse within the positive portion of the first series of output pulses for generating an output signal indicative of less than said predetermined capacitance between said members.

3. A method of detecting capacitance, which comprises:

connecting an unknown capacitor into one stage of a free running multivibrator to produce (1) a first output pulse train having constant duration pulses spaced in accordance with the capacitance value of the connected capacitor, and (2) a second complementary output pulse train having pulse durations determined by the capacitance value of the connected capacitor;

using each transition in a first direction of each pulse of the first train for generating a delayed timing pulse;

comparing the delayed timing pulse with both said trains of pulses;

setting the delayed timing pulses to coincide with the complementary pulses of the second train when the connected capacitor is above a predetermined capacitance value and to coincide with the pulses of the first train when the capacitance is below the predetermined value;

detecting the coincidence between the timing pulses and the complementary pulses of the second train to produce a signal indicating that the capacitance of the connected capacitor is above said predetermined value; and detecting the coincidence between the timing pulses and the pulses of the first train to produce a signal indicating that the capacitance of the connected capacitor is below said predetermined value.

4. A method of ascertaining connections between wires of a cord and terminals at each end of the wires, which comprises:

applying current through the terminals and the wires;

sensing the passage of the current through each wire and the terminals connected thereto to determine which wires are not connected to one or both terminals;

selecting as a reference wire, a wire through which current is sensed as passing through the wire and both terminals;

selecting as a defective wire, a wire through which no current is sensed;

connecting one terminal of the reference wire and one terminal of the defective wire as a capacitance in one stage of a cross-coupled multivibrator to generate a first pulse train having pulses timed in accordance with the capacitance between the connected reference wire and the connected defective wire and a second complementary pulse train;

generating a series of delayed test pulses from the negative going transitions of the first pulse train; and comparing the delayed test pulses with said trains of pulses to produce a first good signal when the test pulses coincide with the complementary pulse train produced by a terminal being secured to the defective wire and a second bad signal when the test pulses coincide with the first pulse train produced by the defective wire not being connected to a terminal.

5. A method of indicating connections between a group of wires of a cable and terminals secured at both ends of each wire, which comprises:

connecting a terminal which is properly secured to a wire in the cable to one side of capacitance network of one stage of a two stage cross-coupled multivibrator;

connecting a terminal of a test wire having one or both terminals not secured to the test wire to a second side of the capacitance network to produce a first pulse train emanating from said one stage of said multivibrator wherein the pulses are timed at a first frequency in accordance with capacitance between both wires having properly secured terminals connected to the capacitance network, and at a second higher frequency when the terminal of the test wire connected to the capacitance network is not secured to the test wire;

generating a series of timing pulses upon each transition in the same direction of each of said pulses in said first train;

generating a second pulse train emanating from the second stage of said multivibrator which is complementary to said first pulse train;

comparing said timing pulses with both said first and second pulse train;

producing a signal indicative of a non-secured terminal when said timing pulses coincide with the pulses of said first pulse train; and producing a signal indicative of a secured terminal when said timing pulses coincide with the complementary second pulse train.

6. A system for checking the integrity of connections between wires of a cable and associated terminals secured to the ends of the wires, which comprises:

means for sequentially applying current through the terminals and wires connected thereto to test the connections of the terminals to the wires;

means responsive to a failure of current to flow through a wire and the terminals connected thereto for indicating such failure of current flow;

a multivibrator having a pair of cross-coupled capacitance networks;

means for connecting one of the terminals of a wire with properly connected terminals to the multivibrator to connect said wire and terminals as one capacitance plate in a first of said capacitance networks;

means for connecting one of the terminals of a wire with an improperly connected terminal to the multivibrator to connect said wire and terminals as a second capacitance plate in the first of said capacitance networks;

a pair of gating circuits, each of which has a pair of inputs which must simultaneously receive input voltages for operation;

means for applying outputs from the first capacitance network to a first input of a first of said pair of gating circuits;

means for applying outputs from the second capacitance network to a first input of a second of said pair of gating circuits;

an one-shot multivibrator actuated in response to each positive to negative transition in the voltage output from the first capacitance network for generating a delayed narrow strobe pulse and applying said delayed strobe pulses to the second inputs of said gating circuits; and means for setting the delay in each strobe pulse to coincide with the positive pulse applied to the first input of said second gating circuit when the terminals of the wires connected to the multivibrator are properly connected to the associated wires; and to coincide with the positive pulse applied to the first input of said second gating circuit when one of the terminals connected to the multivibrator is not properly connected to the associated wire.

7. A method of testing the proper connections of an electrical cord having at least two wires individually connected at opposite ends to blade terminals of a pair of plugs, which comprises:

connecting both plugs into a circuit to sequentially test the continuity of current flow through blade terminals connected at each end of each wire;

connecting one of said plugs of said cord into a first capacitance network of a two capacitance network multivibrator circuit, when said continuity test indicates continuity through at least one wire and the terminals connected thereto and said continuity test indicates that at least one blade terminal is improperly connected to a wire, said connecting being such that the good wire and blade contacts are connected as one plate in the first capacitance network and the other improperly connected blade contacts and wire are connected as a second plate of said first capacitance network;

applying the output of the first capacitance network of said multivibrator to a first gating circuit;

applying the output of the second capacitance network of said multivibrator to a second gating circuit;

applying said output from said first capacitance network to a one-shot multivibrator to generate a delayed strobe pulse upon each positive to negative transition in said applied output;

applying said delayed strobe pulses to both of said gating circuits; and setting said one-shot multivibrator to generate the delayed strobe pulses to coincide (1) with the positive going pulse from said first capacitance network when the blade contact connected to said first capacitance network is not properly connected to the wire to actuate the first gating circuit to generate a signal indicative of an improper blade to wire connection, and (2) with the positive going pulse from said second capacitance network when the blade contact connected to said first capacitance network is properly connected to the wire to actuate the second gating circuit to generate a signal indicative of a proper blade to wire connection.

* * * * *